(12) United States Patent
Seo et al.

(10) Patent No.: US 9,484,344 B2
(45) Date of Patent: Nov. 1, 2016

(54) SEMICONDUCTOR APPARATUS

(71) Applicant: SK hynix Inc., Icheon-si, Gyeonggi-do (KR)

(72) Inventors: Ji Tai Seo, Icheon-si (KR); Yeon Ok Kim, Icheon-si (KR)

(73) Assignee: SK hynic Inc., Icheon-si (KR)

( * ) Notice: Subject to any disclaimer, the term of this patent is extended or adjusted under 35 U.S.C. 154(b) by 331 days.

(21) Appl. No.: 14/186,594

(22) Filed: Feb. 21, 2014

(65) Prior Publication Data

US 2015/0155278 A1   Jun. 4, 2015

(30) Foreign Application Priority Data

Dec. 2, 2013 (KR) .......... 10-2013-0148462

(51) Int. Cl.
*H01L 27/08* (2006.01)
*H01L 29/94* (2006.01)
*H01L 27/108* (2006.01)

(52) U.S. Cl.
CPC .......... *H01L 27/0805* (2013.01); *H01L 29/94* (2013.01); *H01L 27/10897* (2013.01)

(58) Field of Classification Search
CPC .............. H01L 27/0805; H01L 27/10897
USPC .............................................. 257/296, 365
See application file for complete search history.

(56) References Cited

U.S. PATENT DOCUMENTS 6,737,929 B1 * 5/2004 Cui ..................... H01L 27/0808
257/288

FOREIGN PATENT DOCUMENTS

JP         05259383 A  * 10/1993
KR   1020030070817 A     9/2003

* cited by examiner

*Primary Examiner* — Errol Fernandes
(74) *Attorney, Agent, or Firm* — William Park & Associates Ltd.

(57) ABSTRACT

A semiconductor apparatus includes a reservoir capacitor, and the reservoir capacitor includes a plurality of MOS capacitors serially coupled to one another. The plurality of MOS capacitors are arranged in one well.

18 Claims, 4 Drawing Sheets

SEMICONDUCTOR APPARATUS

CROSS-REFERENCES TO RELATED APPLICATION

The present application claims priority under 35 U.S.C. §119(a) to Korean application number 10-2013-0148462, filed on Dec. 2, 2013, in the Korean Intellectual Property Office, which is incorporated herein by reference in its entirety as set forth in full.

BACKGROUND

1. Technical Field

Various embodiments generally relate to a reservoir capacitor, and more particularly, to a semiconductor apparatus including a reservoir capacitor.

2. Related Art

In general, a semiconductor apparatus such as DRAM (Dynamic Random Access Memory) includes stabilization capacitors called reservoir capacitors and arranged in a spare area of a peripheral area adjacent to a memory block, in order to stabilize a voltage from noise.

As the reservoir capacitor, a transistor type structure using a MOS transistor manufacturable using a CMOS (Complementary Metal-Oxide Semiconductor) process, and a well type structure using a well have been extensively used.

The transistor type reservoir capacitor includes a gate dielectric layer formed on a substrate, a gate formed on the gate dielectric layer, and a source and a drain formed in a well exposed at both sides of the gate.

A voltage, which is equal to or more than a threshold value tolerable by the gate dielectric layer, may be applied to the reservoir capacitor. As described above, when the voltage, which is equal to or more than the threshold value tolerable by the gate dielectric layer, is applied, the gate may be damaged. When the gate is damaged, since a current path from the gate to the substrate is formed, a semiconductor apparatus may fail.

In this regard, in order to install the reservoir capacitor to which a voltage higher than the threshold value of the gate dielectric layer is applied, a plurality of MOS capacitors may be used because the semiconductor apparatus may fail because of one MOS capacitor. Particularly, as illustrated in FIG. 1 and FIG. 2, it is preferable to serially couple MOS capacitors to each other. FIG. 1 is a circuit diagram of a conventional 2-stage serial MOS capacitor and FIG. 2 is an equivalent circuit diagram of FIG. 1.

Each MOS capacitor may include a gate-source capacitor, a gate-body (bulk) capacitor, and a gate-drain capacitor, that is, three parallel capacitors cgs, cgb, and cgd. When it is assumed that the sizes of the MOS capacitors are substantially equal to one another, a voltage of 1/n is applied to each MOS capacitor (where n may be a non-negative integer).

FIG. 3 is a layout diagram of a conventional reservoir capacitor.

As illustrated in FIG. 1 to FIG. 3, the reservoir capacitor may include a first MOS capacitor 10, and a second MOS capacitor 20 serially coupled to the first MOS capacitor 10. The first MOS capacitor 10 being coupled to a high voltage level and the second MOS capacitor 20 being coupled between the first MOS capacitor 10 and a ground voltage VSS.

Referring to FIG. 3, the first MOS capacitor 10 is arranged in a first area 10a and the second MOS capacitor 20 is arranged in a second area 20a. For example, the first area 10a may be an R-type well. The first area 10a may be surrounded by a N-type well 2. The first MOS capacitor 10 includes a first gate 11, a first source 13, and a first drain 15. Accordingly a gate-source capacitor cgs1 may be generated between the first source 13 and the first gate 11, a gate-bulk capacitor cgb1 may be generated between the first gate 11 and the first area 10a, and a gate-drain capacitor cgd1 may be generated between the first drain 15 and the first gate 11. The capacitors cgs1, cgb1 and cgd1 may be formed in parallel with one another as described above.

The second area 20a may be a P-type silicon substrate 1. The second MOS capacitor 20 includes a second gate 21, a second source 23 and a second drain 25. Accordingly, a gate-source capacitor cgs2 may be generated between the second source 23 and the gate 21, a gate-bulk capacitor cgb2 may be generated between the second gate 21 and the second area 20a, and a gate-drain capacitor cgd2 may be generated between the second drain 25 and the second gate 21. The capacitors cgs2, cgb2 and cgd2 may be formed in parallel with one another, similarly to the first MOS capacitor 10.

The first gate 11 is connected to a voltage terminal which may be inputted with a high voltage. The second gate 21 is connected to the first source 13 and the first drain 15, in common. The second source 23 and the second drain 25 are connected to the ground voltage terminal VSS, in common.

However, respective MOS capacitors constituting the reservoir capacitor are formed in wells different from each other, resulting in an increase in the occupation area of the semiconductor apparatus.

SUMMARY

In an embodiment, a semiconductor apparatus may include a reservoir capacitor, wherein the reservoir capacitor may include a plurality of MOS capacitors serially coupled to one another, wherein the plurality of MOS capacitors are arranged in one well.

In an embodiment, a semiconductor apparatus may include a reservoir capacitor, the reservoir capacitor including: a first MOS capacitor serially coupled to a second MOS capacitor, wherein the first and second MOS capacitors are formed in the same well.

In an embodiment a semiconductor apparatus may include: a semiconductor substrate including a first area; and a reservoir capacitor including a first MOS capacitor and a second MOS capacitor, wherein the first MOS capacitor and the second MOS capacitor are arranged in a first area.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the present disclosure will be described in detail with reference to the accompanying drawings through various examples of the embodiments. However, the present disclosure is not limited to the embodiments to be described herein, but may be embodied into other forms. The embodiments are provided to describe the present disclosure such that the concept of the present disclosure may be easily understood by those skilled in the art.

Figure 1:
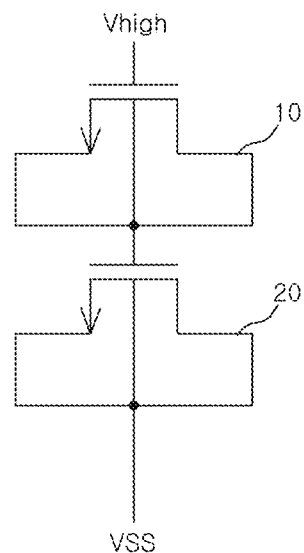
FIG. 1 is a circuit diagram of a conventional reservoir capacitor.
Figure 2:
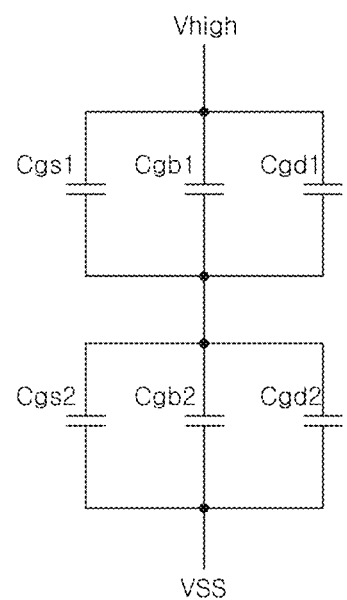
FIG. 2 is a diagram illustrating an equivalent capacitor of a circuit diagram illustrated in FIG. 1.
Figure 3:
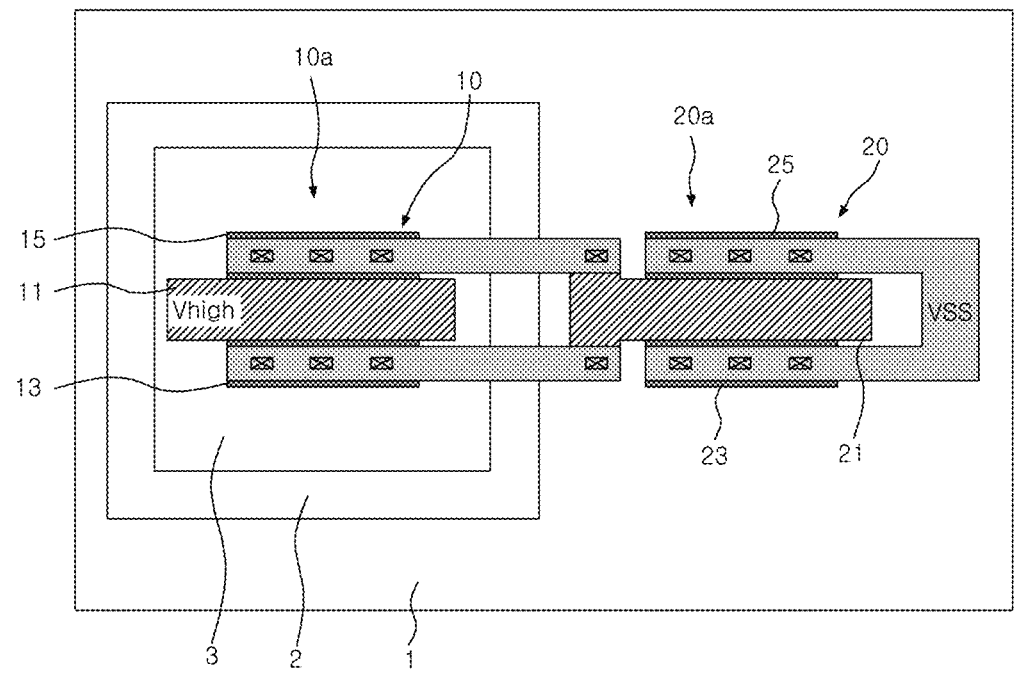
FIG. 3 is a layout diagram of a conventional reservoir capacitor.
Figure 4:
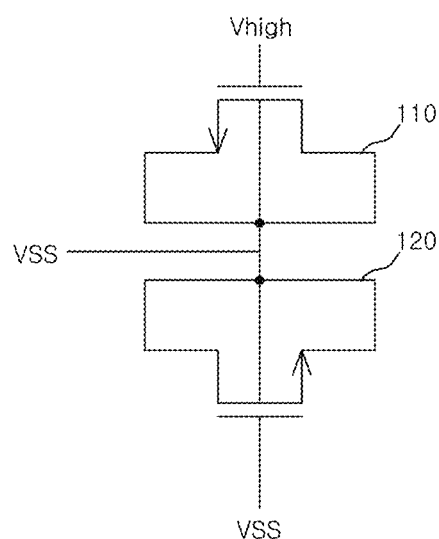
FIG. 4 is a circuit diagram of a reservoir capacitor according to an embodiment.

Referring to FIG. 4, a reservoir capacitor according to an embodiment may include a plurality of MOS capacitors in serial.

For example, the reservoir capacitor may include a first MOS capacitor 110 and a second MOS capacitor 120 serially coupled to the first MOS capacitor 110.

The first and second MOS capacitor 110 and 120 may include a NMOS transistor type. A gate of the first MOS capacitor 110 (hereinafter, a first gate) may be electrically coupled to an external voltage terminal Vhigh and a gate of the second MOS capacitor (hereinafter, a second gate) may be electrically coupled to a ground voltage VSS terminal. A source and drain of the first MOS capacitor 110 (hereinafter a first source and a first drain) are electrically coupled to a source and drain of the second MOS capacitor 120 (hereinafter a second source and a second drain), in common.

Figure 5:
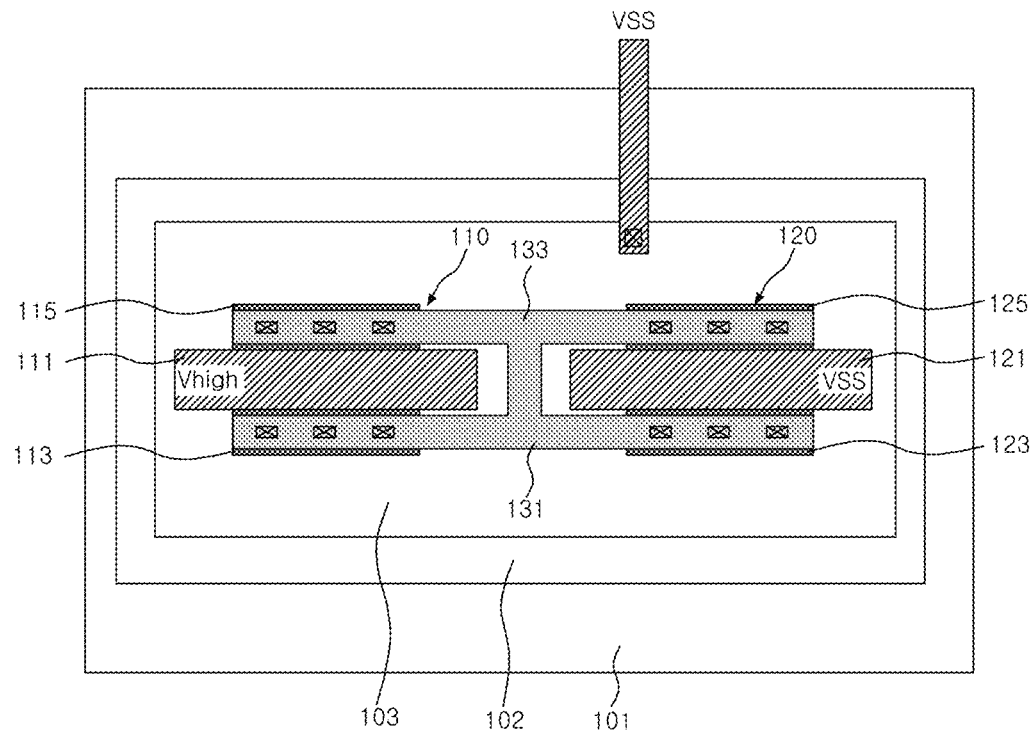
FIG. 5 is a layout diagram of a reservoir capacitor according to an embodiment.

Referring to FIG. 5, a semiconductor substrate 101 may include a first well 102 and a second well 103. The second well 103 may be surrounded by the first well 102. For example, the second well 103 may be formed in the first well 103 as like a retrograde well (or R-Well). The first well 102 may include a first conductive type, the second well 103 may include a second conductive type and the semiconductor substrate 101 may include a first conductive type. The second well 103 in which the first and second MOS capacitors 110 and 120 are formed may be applied to the ground voltage VSS.

The first MOS capacitor 110 and the second MOS capacitor 120 may be formed in the second well 103. The first MOS capacitor 110 may include a first gate 111 and a first source 113 and a first drain 115 formed at both sides of the first gate 111. The second MOS capacitor 120 may include a second gate 121 and a second source 123 and a second drain 125 formed at both sides of the second gate 121.

The first MOS capacitor 110 and the second MOS capacitor 120, respective bulks, that is, channels may be formed in substantially the same well.

The source 113 of the first MOS capacitor 110 and the source 123 of the second MOS capacitor 120 are electrically coupled to each other through a first interconnection 131 in common. The drain 115 of the first MOS capacitor 110 and the drain 125 of the second MOS capacitor 120 are electrically coupled to each other through a second interconnection 133 in common.

That is, in an embodiment, the first MOS capacitor 110 and the second MOS capacitor 120 share the source, the drain, and the bulk. A high voltage Vhigh is applied to the gate 111 of the first MOS capacitor 110 and a ground voltage VSS is applied to the gate 121 of the second MOS capacitor 120.

Accordingly, the first MOS capacitor 110 may operate in an accumulation mode and the second MOS capacitor 120 may operate in a depletion mode. In this case, since capacitance of the first MOS capacitor 110 does not accurately coincide with capacitance of the second MOS capacitor 120, but the difference between capacitance values of the first MOS capacitor 110 and the second MOS capacitor 120 is minimal, a similar voltage is applied to the first and second MOS capacitors 110 and 120.

The first and second MOS capacitors 110 and 120 have been described by applying NMOS transistors as an example. However, PMOS transistors may be applied. Of course, in the case of applying the PMOS transistors, each MOS capacitor is arranged in the first type well.

Figure 6:
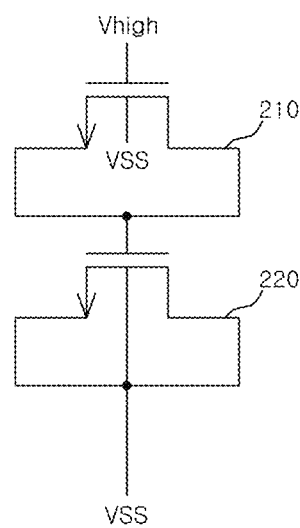
FIG. 6 is a circuit diagram of a reservoir capacitor according to an embodiment.
Figure 7:
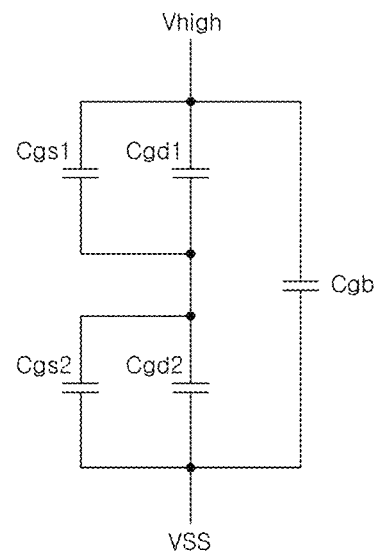
FIG. 7 is a diagram illustrating an equivalent capacitor of a circuit diagram illustrated in FIG. 6.
Figure 8:
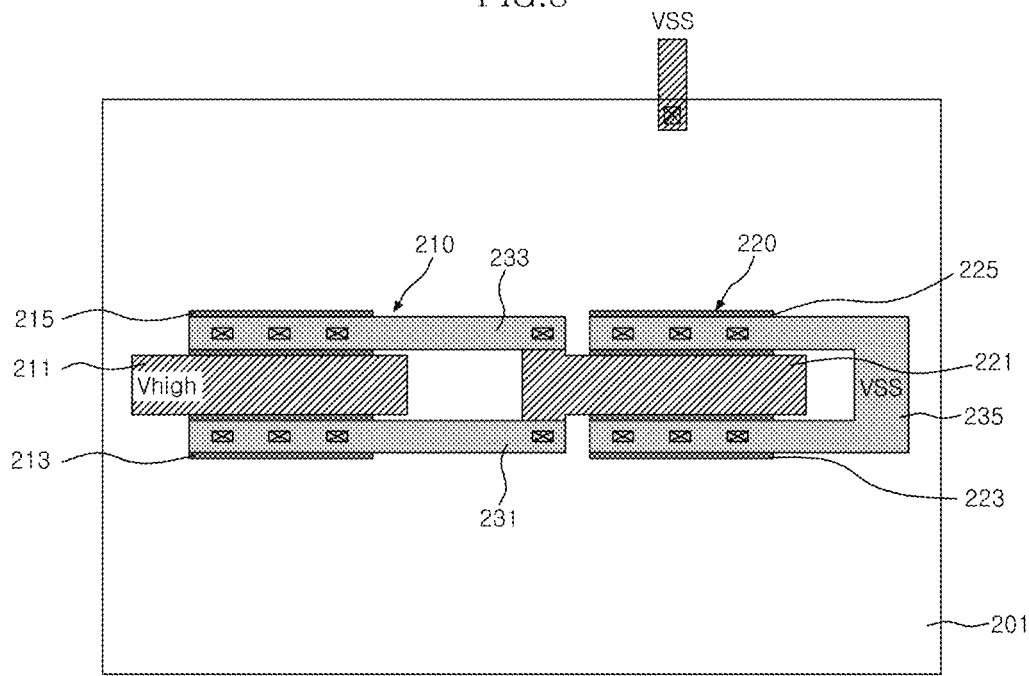
FIG. 8 is a layout diagram of a reservoir capacitor according to an embodiment.

Referring to FIG. 6 to FIG. 8, a reservoir capacitor according to an embodiment includes a first MOS capacitor 210, and a second MOS capacitor 220 serially coupled to the first MOS capacitor 210.

The first MOS capacitor 210 includes a first gate 211 and a first source 213 and a first drain 215 formed at both sides of the first gate 211. The first gate 211 may be formed at an upper side of a semiconductor substrate 201 having the second conductive type, and the first source 213 and the first drain 215 may be formed by implanting impurities having the first conductive type into the semiconductor substrate 201. In other words, the first gate 211 is formed on a gate dielectric layer (not illustrated) formed on the P type substrate 201.

The second MOS capacitor 220 includes a second gate 221 and a second source 223 and a second drain 225 formed at both sides of the second gate 221. The second gate 221 may be formed in substantially the same well as that of the aforementioned first MOS capacitor 210, that is, at an upper side of the second type substrate 201, and the second source 223 and the second drain 225 may be formed by implanting the impurities having the first conductive type into the second type substrate 201.

In other words, the first MOS capacitor 210 and the second MOS capacitor 220 share respective bulks, that is, channels in substantially the same well, that is, the P type substrate 201.

In the above structure, the source 213 and the drain 215 of the first MOS capacitor 210 are electrically coupled to the gate 221 of the second MOS capacitor 220 through first and second interconnections 231 and 233. Furthermore, a high voltage Vhigh is applied to the gate 211 of the first MOS capacitor 210 and a ground voltage VSS is applied to the source 223 and the drain 225 of the second MOS capacitor 220 through a third interconnection 235.

FIG. 7 is an equivalent circuit diagram of FIG. 6. The first MOS capacitor may include a gate-source capacitor Cgs or first gate-source capacitor Cgs1, a gate-drain capacitor Cgd or first gate-drain capacitor Cgd1, and a gate-body (bulk) capacitor Cgb. The second MOS capacitor may include a gate-source capacitor Cgs or second gate-source capacitor Cgs2, a gate-drain capacitor Cgd or second gate-drain capacitor Cgd2, and a gate-body (bulk) capacitor Cgb. That is, in an embodiment, the first MOS capacitor 210 and the second MOS capacitor 220 share the bulk Cgb. Furthermore, the high voltage Vhigh and the ground voltage VSS are directly applied between the gate and the bulk. However, when the high voltage Vhigh sufficiently increases in the range in which the gate is tolerable, a channel may be formed between the source and the drain. At this time, gate source capacitor Cgs is formed between the gate and the channel and has no relation with a voltage difference between the gate and the bulk. Accordingly, it is possible to arrange two NMOS transistors on the P type substrate.

In an embodiment, the first and second MOS capacitors 210 and 220 have been described by employing NMOS transistors as an example. However, two PMOS transistors may be arranged on the first type substrate.

Consequently, in the embodiments, a plurality of MOS capacitors are arranged to be serially coupled to one another in one well, so that a well space necessary between wells is not required as compared with the case in which respective MOS capacitors are arranged in wells different from each other, resulting in the reduction of an occupation area of a semiconductor apparatus.

While various embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus including a reservoir capacitor, wherein the reservoir capacitor comprises:
   a plurality of MOS capacitors serially coupled to one another,
   wherein the plurality of MOS capacitors are arranged in one well, and
   wherein, in each of the plurality of MOS capacitors, a gate-source capacitor, a gate-bulk capacitor, and a gate-drain capacitor are arranged to be parallel with one another.

2. The semiconductor apparatus according to claim 1, wherein the plurality of MOS capacitors share one gate-bulk capacitor.

3. The semiconductor apparatus according to claim 2, wherein the plurality of MOS capacitors share one gate-drain capacitor and one gate-source capacitor, respectively.

4. The semiconductor apparatus according to claim 3, wherein a high voltage is applied to one of the plurality of MOS capacitors, and a ground voltage is applied to a remaining one of the plurality of MOS capacitors.

5. The semiconductor apparatus according to claim 2, wherein source and drain of one of the plurality of MOS capacitors are electrically coupled to a gate of another MOS capacitor adjacent to the one of the plurality of MOS capacitors.

6. The semiconductor apparatus according to claim 5, wherein the reservoir capacitor includes a first MOS capacitor and a second MOS capacitor, a high voltage is applied to a gate of the first MOS capacitor of the plurality of MOS capacitors, and a ground voltage is applied to a source and drain of the second MOS capacitor of the plurality of MOS capacitors.

7. A semiconductor apparatus including a reservoir capacitor, wherein the reservoir capacitor comprises:
   a first MOS capacitor serially coupled to a second MOS capacitor,
   wherein the first and second MOS capacitors are formed in the same well,
   wherein, in each of the first and second MOS capacitors, a gate-source capacitor, a gate-bulk capacitor, and a gate-drain capacitor are arranged to be parallel with one another.

8. The semiconductor apparatus of claim 7, wherein the first and second MOS capacitors share the same R-type well.

9. The semiconductor apparatus of claim 7, wherein a source of the first and second MOS capacitors are commonly coupled to each other through a first interconnection.

10. The semiconductor apparatus of claim 7, wherein a drain of the first and second MOS capacitors are commonly coupled to each other through a second interconnection.

11. The semiconductor apparatus of claim 7, wherein a gate of the first MOS capacitor is configured to receive a high voltage, and
    wherein a gate of the second MOS capacitor is configured to receive a ground voltage.

12. The semiconductor apparatus of claim 7, wherein a source and a drain of the first MOS capacitor is electrically coupled to a gate of the second MOS capacitor through first and second interconnections.

13. The semiconductor apparatus of claim 12, wherein a gate of the first MOS capacitor is configured to receive a high voltage, and
    wherein a source and a drain of the second MOS capacitor is configured to receive a ground voltage through a third interconnection.

14. A semiconductor apparatus, comprising:
    a semiconductor substrate including a first area; and
    a reservoir capacitor including a first MOS capacitor and a second MOS capacitor,
    wherein the first MOS capacitor and the second MOS capacitor are arranged in a first area,
    wherein, in each of the first and second MOS capacitors, a gate-source capacitor, a gate-bulk capacitor, and a gate-drain capacitor are arranged to be parallel with one another.

15. The semiconductor apparatus of claim 14, further comprising: a second area formed in the semiconductor substrate to surround the first area.

16. The semiconductor apparatus of claim 15, wherein a conductive type of the first area is opposite to that of the second area.

17. The semiconductor apparatus of claim 14, wherein a gate of the first MOS capacitor is configured to receive a high voltage, and a source of the first MOS capacitor is electrically coupled to a source of the second MOS capacitor, and a drain of the first MOS capacitor is electrically coupled to a drain of the second MOS capacitor, and wherein a gate of the second MOS capacitor is configured to receive a ground voltage.

18. The semiconductor apparatus of claim 14, wherein a gate of the first MOS capacitor is configured to receive a high voltage, a source and drain of the first MOS capacitor are electrically coupled to a gate of the second MOS capacitor in common, and wherein a source and drain of the second MOS capacitor is configured to receive a ground voltage.

* * * * *